US012813299B2

(12) United States Patent

Wu et al.

(10) Patent No.: US 12,813,299 B2

(45) Date of Patent: Nov. 24, 2026

(54) PACKAGE STRUCTURE

(71) Applicant: Advanced Semiconductor Engineering, Inc., Kaohsiung (TW)

(72) Inventors: Po-I Wu, Kaohsiung (TW); Chun-Yen Ting, Kaohsiung (TW); Hung-Chun Kuo, Kaohsiung (TW); Jung Jui Kang, Kaohsiung (TW); Chiu-Wen Lee, Kaohsiung (TW); Shih-Yuan Sun, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 340 days.

(21) Appl. No.: 18/128,988

(22) Filed: Mar. 30, 2023

(65) Prior Publication Data

US 2024/0332192 A1 Oct. 3, 2024

(51) Int. Cl.

| | |
|---|---|
| ***H10W 70/65*** | (2026.01) |
| ***G02B 6/12*** | (2006.01) |
| ***G02B 6/42*** | (2006.01) |
| ***H10W 40/10*** | (2026.01) |
| ***H10W 72/00*** | (2026.01) |
| ***H10W 72/20*** | (2026.01) |
| ***H10W 74/15*** | (2026.01) |
| ***H10W 90/00*** | (2026.01) |

(52) U.S. Cl.

CPC ........ *H10W 70/65* (2026.01); *G02B 6/12004* (2013.01); *H10W 40/10* (2026.01); *H10W 90/00* (2026.01); *H10W 74/15* (2026.01); *H10W 90/701* (2026.01); *H10W 90/722* (2026.01); *H10W 90/724* (2026.01); *H10W 90/734* (2026.01)

(58) Field of Classification Search

CPC ................. H01L 23/5381; H01L 23/36; H01L 23/49816; H01L 24/16; H01L 24/32; H01L 24/73; H01L 25/167; H01L 2224/16145; H01L 2224/16225; H01L 2224/32225; H01L 2224/73204; G02B 6/12004; G02B 6/4274; G02B 6/428

See application file for complete search history.

(56) References Cited

U.S. PATENT DOCUMENTS

| | | | | |
|---|---|---|---|---|
| 10,416,378 | B2 * | 9/2019 | Zhang | G02B 6/43 |
| 10,867,982 | B1 * | 12/2020 | Yu | H01L 23/49833 |
| 11,611,004 | B2 * | 3/2023 | Amano | G02B 6/136 |
| 12,406,962 | B2 * | 9/2025 | Elsherbini | H01L 25/16 |
| 2011/0316170 | A1 * | 12/2011 | Muramatsu | H01L 23/49816 257/E21.585 |
| 2014/0029639 | A1 * | 1/2014 | Zarbock | G02B 6/4269 372/50.1 |
| 2014/0270784 | A1 * | 9/2014 | Thacker | H04B 10/27 398/115 |
| 2020/0003950 | A1 * | 1/2020 | Yu | G02B 6/12004 |

(Continued)

*Primary Examiner* — Thomas A Hollweg

*Assistant Examiner* — Erin D Chiem

(74) *Attorney, Agent, or Firm* — Foley & Lardner LLP

(57) ABSTRACT

A package structure is provided. The package structure includes a bridge component, a photonic processing unit, and an electrical device. The photonic processing unit is disposed over the bridge component. The electrical device is disposed over the bridge component. The bridge component is configured to optically couple with the photonic processing unit and electrically connect with the electronic component.

20 Claims, 7 Drawing Sheets

(56) References Cited

U.S. PATENT DOCUMENTS

| | | | | |
|---|---|---|---|---|
| 2020/0174205 | A1* | 6/2020 | Kubo | H05K 1/181 |
| 2022/0020848 | A1* | 1/2022 | Moens | H10D 62/115 |
| 2022/0199600 | A1* | 6/2022 | Zhang | H01L 25/167 |
| 2022/0206221 | A1* | 6/2022 | Ravichandran | G02B 6/4295 |

* cited by examiner

PACKAGE STRUCTURE

BACKGROUND

1. Field of the Disclosure

The present disclosure relates to a package structure.

2. Description of the Related Art

A package including a processing unit, a memory, and a bridge unit electrically connected the processing unit with the memory is known. However, the bandwidth of the electrical transmission provided by the bridge unit may be insufficient for the communication between the processing units and memory with more advanced technology or nodes.

SUMMARY

In some embodiments, a package structure includes a bridge component, a photonic processing unit, and an electrical device. The photonic processing unit is disposed over the bridge component. The electrical device is disposed over the bridge component. The bridge component is configured to optically couple with the photonic processing unit and electrically connect with the electronic component.

In some embodiments, a package structure includes a signal transmission component and an electro-optic conversion unit. The signal transmission component includes a plurality of optical I/O units and a plurality of electrical I/O units. The electro-optic conversion unit is configured to convert optical signals to electrical signals or convert the electrical signals to the optical signals. The signal transmission component includes a first transmission path configured to transmit the optical signals from or to the optical I/O units, and a second transmission path configured to transmit the electrical signals from or to the electrical I/O units. The electro-optic conversion unit connects with the first transmission path or the second transmission path or both.

In some embodiments, a package structure includes a bridge component, a photonic processing unit, and an optical component. The bridge component includes a first surface and a second surface different from the first surface. The photonic processing unit is disposed over and optically connects with the first surface of the bridge component. The optical component optically connects with the second surface of the bridge component. The optical component communicates with the photonic processing component through the bridge component.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
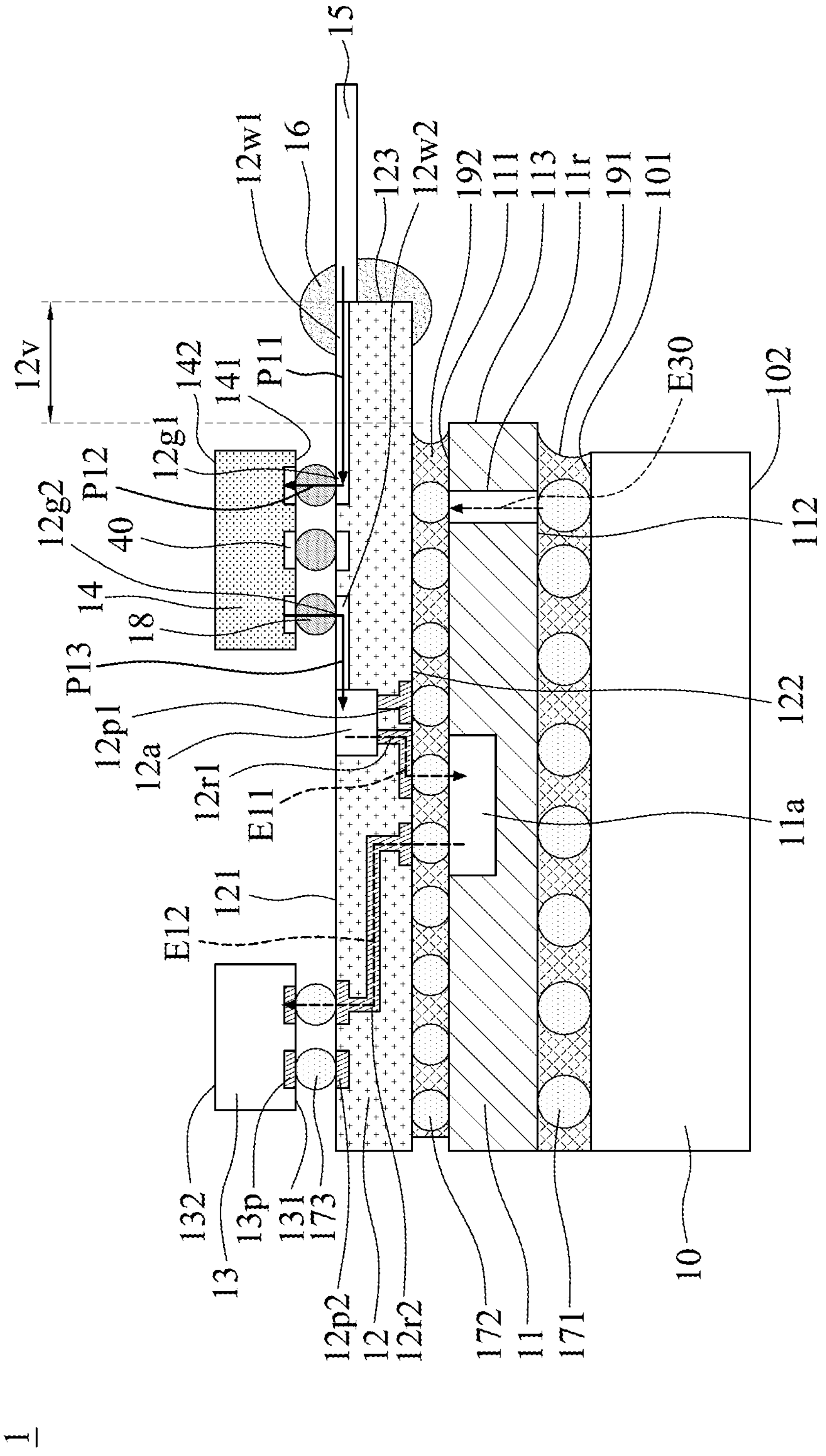
FIG. 1 is a cross-sectional view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a cross-sectional view of a package structure 1 according to some embodiments of the present disclosure. The package structure 1 may include a carrier 10, a wiring structure 11, a component 12, an electrical component 13, a photonic component 14, an optical component 15, an adhesive material 16, a plurality of connection elements 171, 172, and 173 (or electrical connection elements), a plurality of connection elements (or optical connection elements) 18, a protective element 191, and a protective element 192.

The carrier (or a substrate) 10 may have a surface 101 and a surface 102 opposite to the surface 101. In some embodiments, the carrier 10 may be or include, for example, a printed circuit board (PCB), such as a paper-based copper foil laminate, a composite copper foil laminate, or a polymer-impregnated glass-fiber-based copper foil laminate, or so on. In some embodiments, the carrier 10 may include a semiconductor substrate including silicon, germanium, or other suitable materials. In some embodiments, the carrier 10 may be or include a redistribution structure.

The wiring structure 11 may be disposed over the carrier 10. The wiring structure 11 may have a surface 111 facing the component 12, a surface 112 opposite to the surface 111 and facing the carrier 10, and a lateral surface 113 extending between the surface 111 and the surface 112. The carrier 10 may be electrically connected to the wiring structure 11 through the connection elements 171. The connection elements 171 may be disposed between the surface 112 of the wiring structure 11 and the surface 101 of the carrier 10. The connection elements 17 may include solder balls, controlled collapse chip connection (C4) bumps, a ball grid array (BGA), or a land grid array (LGA). The wiring structure 11 may be or include an interposer. The wiring structure 11 may be or include a silicon interposer. The wiring structure 11 may include one or more dielectric layers and conductive element(s) (e.g., conductive layer, conductive trace, conductive pad, and/or conductive via) disposed on or embedded in the dielectric layer(s). The wiring structure 11 may include one or more conductive pillars 11*r* extending from the surface 111 of the wiring structure 11 to the surface 112 of the wiring structure 11. The conductive pillars 11*r* may penetrate through the wiring structure 11. The conductive pillars 11*r* may be configured to transmit a power signal E30 from the carrier 10 to the component 12. In some embodiments, the wiring structure 11 may be or include an interposer, such as a silicon (Si) interposer.

The component 12 may be disposed over the wiring structure 11. In some embodiments, the component 12 is flip-chip bonded to the wiring structure 11. In some embodiments, at least a portion (e.g., 12*v*) of a projection of the component 12 in a vertical direction does not overlap the wiring structure 11. In some embodiments, the portion 12*v* in a vertical direction does not overlap the photonic component 14. In some embodiments, a portion 12*v* of the component 12 extends outwardly with respect to the lateral surface 113 of the wiring structure 11. In some embodiments, the portion 12*v* of the component 12 overhangs the wiring structure 11. The component 12 may have a surface (or an upper surface) 121 and a surface (or a lower surface) 122 opposite to the surface 121. The surface 122 of the component 12 may face the surface 111 of the wiring structure 11. The component 12 may have a surface (or a lateral surface) 123 extending between the surface 121 and the surface 122 of the component 12 and located at the portion 12*v*. The surface 123 is different from the surface 121 or 122.

The portion 12*v* of the component 12 may be referred to an overhang or an overhang portion. In some embodiments, the portion (or the overhang portion) 12*v* of the component 12 may be optically coupled with the optical component 15 through grating coupling or edge coupling, etc. The optical component 15 may be or include an optical fiber. The optical component 15 may be or include a fiber array unit including a plurality of optical fibers. In FIG. 1, the optical component 15 may be connected or attached to the lateral surface 123 by an adhesive material (or protective material) 16. The optical component 15 may be optically coupled with the component 12 and communicate with the photonic processing unit 14. The adhesive material (or protective material) 16 may encapsulate a coupling end of the optical component 15. The adhesive material (or protective material) 16 may include epoxy or other another suitable polymeric material. The adhesive material (or protective material) 16 may have a coefficient of thermal expansion (CTE) different from that of the protective element 191.

In some embodiments, the component 12 may have a thickness in a range from about 200 μm to about 300 μm, such as, 200 μm, 210 μm, 220 μm. 230 μm, 240 μm, 250 μm, 260 μm, 270 μm, 280 μm, 290 μm, or 300 μm, but is not limited thereto. In some embodiments, the portion 12*v* of the component 12 may have a length in a range from about 30 μm to about 200 μm, such as, 30 μm, 50 μm, 80 μm, 100 μm, 120 μm, 150 μm, 180 μm, or 200 μm, but is not limited thereto.

In some embodiments, the component 12 may be configured to function as a bridge component (or bridge unit) connecting the photonic component 14 and the electronic component 13. In some embodiments, the component 12 may be configured to transmit signal(s) (e.g., data signal(s)) between the photonic component 14 and the electronic component 13. The component 12 may be configured to transmit signal(s) (e.g., data signal(s)) between the photonic component 14 and the optical component 15. The component 12 may have a first transmission path configured to transmit optical signals P11 or P13 (e.g., optical data signals) and a second transmission path configured to transmit electric signals E12 (e.g., electric data signals). In some embodiments, the first transmission path is configured to transmit optical signals P13 from or to the photonic component 14 or configured to transmit optical signals P11 from or to the optical component 15. In some embodiments, the first transmission path configured to transmit the optical signals P11 from or to the optical component 15 may be referred to as "third transmission path". In some embodiments, the second transmission path is configured to transmit electric signals E12 (e.g., electric data signals) from or to the electronic component 13. In some embodiments, the component 12 may further have a transmission path (i.e., the fourth transmission path) configured to transmit power signals (not shown) received from the wiring structure 11. In some embodiments, the component 12 includes or consists essentially of transmission paths for transmitting electrical signals, optical signals and power signals and an electro-optic conversion unit to convert electrical signals to optical signals or convert optical signals to electrical signals. In some embodiments, the component 12 may not include additional active device(s). In some embodiments, the component 12 may be referred to as a bridge component or a signal transmission component.

The component 12 may include one or more transmission path(s) for transmitting optical signal(s). In some embodiments, the component 12 may include a waveguide 12*w*1 and a waveguide 12*w*2 located at or adjacent to the surface 121 of the component 12. The waveguide 12*w*1 may include one or more I/O units (or optical I/O units) 12*g*1. The I/O units 12*g*1 may optically couple with the connection elements (optical connection elements) 18. The waveguide 12*w*1 may optically couple with the photonic component 14 through the optical connection elements 18. The optical connection elements 18 may be disposed between the photonic component 14 and the component 12. The optical connection elements 18 may include material for guiding the light (e.g., optical signals) therethrough. The optical connection elements 18 may include an optical bump configured to optically transmit the light (e.g., optical signals) between the component 12 and the photonic component 14. In some embodiments, the term "I/O units" used in the present disclosure may be referred to as "I/O terminals." In some embodiments, the term "optical bump" used in the present disclosure may be referred to as "photonic bump."

The waveguide 12*w*1 may optically couple with the optical component 15, for example, through grating coupling or edge coupling. The component 12 may include an edge coupler, grating coupler, or v-groove(s) at the lateral surface 123, the upper surface 121 or the lower surface 122 so as to couple the waveguide 12*w*1 with the optical component 15.

The waveguide 12*w*1 may be configured to transmit an optical signal P11 from or to the optical component 15. In some embodiments, the waveguide 12*w*1 (or the I/O units 12*g*1) may be configured to transmit the optical signal P11 between the photonic component 14 and the optical component 15, for example, to transmit the optical signal P11 from the optical component 15 to the photonic component 14 through the connection element 18 and vice versa. The I/O units 12*g*1 may include a grating structure transmitting or receiving the optical signals P12. The optical signal P11 may be associated with the optical signal P12, or in some cases, identical to the optical signal P12. The waveguide 12*w*1 may include a beam splitter (or divider) to split a beam (or the optical signal P11) into a plurality of beams (including the optical signal P12. Thus, the intensity of the optical signals P11 and P12 may be different but the wavelength/wave number/frequency may be substantially the same.

The waveguide 12*w*2 may include one or more I/O units (or optical I/O units) 12*g*2. The I/O units 12*g*2 may optically couple with the connection elements (optical connection elements) 18. The waveguide 12*w*2 may optically couple with the photonic component 14 through the optical connection elements 18.

The waveguide 12*w*1 and the waveguide 12*w*2 may include a dielectric material, such as silicon oxide, silicon nitride, or the like. In some embodiments, the waveguide 12*w*1 and the waveguide 12*w*2 may include a core made of silicon or silicon nitride for signal (e.g., light wave) propagation and a cladding layer made of oxide (e.g., silicon oxide) or polymer.

The photonic component 14 may be disposed over the component 12. The photonic component 14 may have a surface 141 facing the surface 121 of the component 12 and a surface 142 opposite to the surface 141. In some embodiments, the photonic component 14 may be or include a photonic processing unit. The photonic processing unit 14 may be configured to process the optical signal P12 and/or the optical signal P13. The photonic processing unit 14 may include a photonic computing processer. The photonic processing unit 14 may include one or more photonic devices to modulate, polarize, or transmit the optical signal P12 and/or the optical signal P13. In some embodiments, the photonic processing unit 14 may be configured to receive the optical signal 11 (or P12) transmitted from the optical component 15, process the optical signal P12 to generate an optical signal P13 and transmit the optical signal 13 to the component 12 (or the I/O units 12*g*2 of the waveguide 12*w*2 of the component 12) through the optical connection elements 18. The I/O units 12*g*2 may include a grating structure transmitting or receiving the optical signals P13. The photonic processing unit 14 may include a plurality of I/O units (or optical I/O units) 40 located at the surface 141 and optically coupled with the optical connection elements 18. The I/O units 40 may include a grating structure transmitting or receiving the optical signals P12 and P13.

The component 12 may include an electro-optic conversion unit 12*a*, a circuit structure 12*r*1, and a circuit structure 12*r*2. The electro-optic conversion unit 12*a* is configured to convert optical signals to electrical signals or convert the electrical signals to the optical signals. The circuit structures 12*r*1 and 12*r*2 may be the transmission paths for electrical signals. The circuit structures 12*r*1 and 12*r*2 may be embedded in the component 12. The electro-optic conversion unit 12*a* may be located between the photonic component 14 and the electronic component 13. In some embodiments, the electro-optic conversion unit 12*a* may be closer to the electronic component 13 than to the photonic component 14 so that a majority of data transmission can be done through optical transmission paths of the component 12 which allows for high bandwidth signal transmission. The circuit structure 12*r*1 may electrically connect the electro-optic conversion unit 12*a* and the wiring structure 11. The wiring structure 11 may include one or more electronic device(s), such as a modulator driver (DRV) or modular 11*a*. In some embodiments, the modulator driver (DRV) or modulator 11*a* may be embedded in the wiring structure 11. The wiring structure 11 may have a thickness in a range from about 775 μm to about 800 μm, but is not limited thereto; and the modulator driver (DRV) or modulator 11*a* may have a thickness in a range from about 700 μm to about 720 μm but is not limited thereto. In some embodiments, the modulator driver (DRV) or modulator 11*a* may include a passive component, such as a resistor, or an active component, such as an amplifier. The circuit structure 12*r*1 may include one or more I/O units (or electrical I/O units) 12*p*1 electrically connected to the modulator driver (DRV) or modulator 11*a* of the wiring structure 11 through the connection elements 172. The one or more I/O units 12*p*1 may be disposed at the surface 122 of the component 12. The circuit structure 12*r*2 may electrically connect the modulator 11*a* of the wiring structure 11 and the electronic component 13 through the connection elements 172. The circuit structure 12*r*2 may include one or more I/O units (or electrical I/O units) 12*p*2 electrically connected to the electronic component 13 through the connection elements 173. The one or more I/O units 12*p*2 may be disposed at the surface 121 of the component 12. The electro-optic conversion unit 12*a* may be located between the optical I/O units 12*g*1 or 12*g*2 and the electrical I/O units 12*p*1 or 12*p*2.

In some embodiments, the electro-optic conversion unit 12*a* may be connected to the first transmission path or the second transmission path or both. The first transmission path is configured to transmit optical signals P13 from or to the optical I/O units 12*g*2. The second transmission path is configured to transmit electrical signals E12 from or to the electrical I/O units 12*p*2.

The optical I/O units 12*g*1 (or 12*g*2) and the electrical I/O units 12*p*1 (or 12*p*2) may be of different densities. The optical I/O units 12*g*1 (or 12*g*2) may have a bandwidth per unit area higher than that of electrical I/O units 12*p*1 (or 12*p*2). The I/O units 12*p*1 and 12*p*2 may include conductive pads. The I/O units 12*p*1 and 12*p*2 and the circuit structures 12*r*1 and 12*r*2 may each include metal such as copper (Cu), gold (Au), aluminum (Al), titanium (Ti) or the like. The insulating layer of the wiring structure 12 may include pre-impregnated composite fibers (e.g., a pre-preg material).

The electro-optic conversion unit 12*a* may be configured to optically couple with the waveguide 12*w*2. The electro-optic conversion unit 12*a* may include a photodiode configured to covert an optical signal to an electrical signal. The electro-optic conversion unit 12*a* may include a laser diode.

The electro-optic conversion unit 12*a* may be configured to receive the optical signal P13 from the photonic component 14 through the waveguide 12*w*2. The electro-optic conversion unit 12*a* may be configured to convert the optical signal P13 to an electrical signal E11. The electro-optic conversion unit 12*a* may be configured to transmit the electrical signal E11 to the circuit structure 12*r*1. The circuit structure 12*r*1 may transmit the electrical signal E11 to the modulator driver (DRV) or modulator 11*a* which may modulate or amplify the electrical signal E11 to an electrical signal E12. The modulator driver (DRV) or modulator 11*a* may be configured to transmit the electrical signal E12 to the electronic component 13 through the circuit structure 12*r*2. In some embodiments, the electrical signal E11 may be referred as to the electrical signal E12 for the purpose of explaining the signal transmission. Therefore, the electro-optic conversion unit 12*a* is configured to receive the optical signals P13 from the photonic component 14 through the optical I/O units 12*g*2, convert the optical signals P13 to the electrical signals E11 or electrical signals E12 (after modulation or amplification), and transmit the electrical signals E11/E12 to the electronic component 13 through the electrical I/O units 12*p*2. It should be noted that the component 12 is capable of bidirectional signal transmission. Thus, the electro-optic conversion unit 12*a* may be configured to receive the electrical signal E11 (came from the electrical signal E12 and modulated or amplified by the modulator driver (DRV) or modulator 11*a*), convert the electrical signal E11 to an optical signal P13 and transmit the optical signal P13 to the photonic component 14 through the waveguide 12*w*2.

The electronic component 13 may be disposed over the component 12. The electronic component 13 may have a surface 131 facing the component 12 and a surface 132 opposite to the surface 131. The electronic component 13 may include a plurality of I/O units 13*p* at the surface 131 electrically connected to the component 12 (e.g., the circuit structure 12*r*2 of the component 12) through the connection elements 173. The I/O units 13*p* may be referred to as electrical I/O units. The I/O units 13*p* may include conductive pads. The electronic component 13 may be or include a memory unit (or a data storage unit). The electronic component 13 may be or include a memory. The electronic component 13 may be or include dynamic random access memory (DRAM), static random access memory (SRAM), magnetoresistive random access memory (MRAM), flash memory, high bandwidth memory (HBM), or other suitable memory.

The photonic component 14 and the electronic component 13 process different types of signals. The photonic component 14 may process optical signals and the electronic component 13 may process electrical signals. The photonic component 14 may be configured to communicate with the electronic component 13 through the component 12. The photonic component 14 may be configured to read and/or write the data stored in the electronic component 13 and transmitted through the component 12. In some embodiments, the component 12 may be configured to convert a first command (e.g., the optical signal P13 from the photonic component 14) to a second command (e.g., the electrical signal E12) that is compatible with the electronic component 13. In some embodiments, the electronic component 13 may transmit data (electrical signals) to the component 12, based on the commands from the photonic component 14 (i.e., P13 and E12), and then the data is converted from electrical signal(s) to optical signal(s) by the electro-optic conversion unit 12*a* and transmitted to the photonic component 14. The component 12 provides a hybrid transmission path (at least including electrical and optical transmission paths) for bidirectional transmitting signals between the photonic component 14 and the electronic component 13. Thus, the component 12 is a bridge, buffer, or interface that realizes the communication between a photonic component, element or structure (e.g., the photonic component 14) and an electronic component, element or structure (e.g., electronic component 13). With the nature of high bandwidth of optical transmission brought by the photonic component 14 and the component 12, the bandwidth and efficiency of the data transmission in the package structure 1 may significantly increase.

In some embodiments, with the optical I/O units 12*g*1 and 12*g*2 and the electrical I/O units 12*p*2 at the same surface, i.e., the surface 121, the component 12 is capable of connecting a photonic component, element or structure (e.g., the photonic component 14) and an electronic component, element or structure (e.g., the electronic component 13) arranged at the same side of the component 12. In some embodiments, with the electrical I/O units 12*p*1 at the surface 122, different from the surface 121, the component 12 is capable of connecting an electronic component, element or structure (e.g., the wiring structure 11).

The protective element 191 may be disposed between the surface 101 of the carrier 10 and the surface 112 of the wiring structure 11. The protective element 191 may surround or enclose the connection elements 171. Owing to capillary action, the protective element 191 may flow along the surface 101 of the carrier 10 and the surface 112 of the wiring structure 11 before curing. The protective element 191 may contact the surface 101 of the carrier 10 and the surface 112 of the wiring structure 11 and have a curved lateral surface (not denoted) after curing.

The protective element 192 may be disposed between the surface 111 of the wiring structure 11 and the surface 122 of the component 12. The protective element 192 may surround or enclose the connection elements 172. Owing to capillary action, the protective element 192 may flow along the surface 111 of the wiring structure 11 and the surface 122 of the component 12 before curing. The protective element 192 may contact the surface 111 of the wiring structure 11 and the surface 122 of the component 12 and have a curved lateral surface (not denoted) after curing.

In some cases where the protective element 191 contacts the protective element 192, a crack between the protective element 192 and the photonic component 14 may occur. In the present disclosure, the amount/volume/size of the protective elements 191 and 192 are controlled so that they can sufficiently surround or enclose the connection elements 171 and 172, respectively, without contacting each other due to an overflow of the protective elements 191 and 192 (especially, the protective element 192) before curing. Furthermore, to avoid the contact between the protective elements 191 and 192, a portion of the wiring structure 11 may protrude from the surface 111 of the wiring structure 11 and function as a barrier to block the overflow of the protective element 192 before curing. In some embodiments, the length of the wiring structure 11 may be greater than the length of the carrier to prevent from the overflow issue of the protective element 192. Some other details will be discussed below with respect to the embodiments illustrated in FIG. 3.

The protective element 191 and the protective element 192 may be or include an encapsulant. The protective element 191 and the protective element 192 may be, for example, an underfill, but is not limited thereto. The protective element 191 and the protective element 192 may include an epoxy resin having fillers, a molding compound (e.g., an epoxy molding compound or other molding compound), polyimide, a phenolic compound or material, a material with a silicone dispersed therein, or a combination thereof.

In some embodiments, the package structure 1 may further include a molding compound (encapsulant) to cover, encapsulate or enclose the photonic component 14, the electronic component 13, the connection elements 173, and the connection elements 18 to protect them or to reinforce the stiffness of the package structure 1. The molding compound may should be spaced apart from the overhanging portion 12*v* or spaced apart at least from an area of the overhanging portion which is optical coupling with the optical component 15. The molding compound may not contact the adhesive material 16 to prevent from a cracking therebetween.

Figure 2:
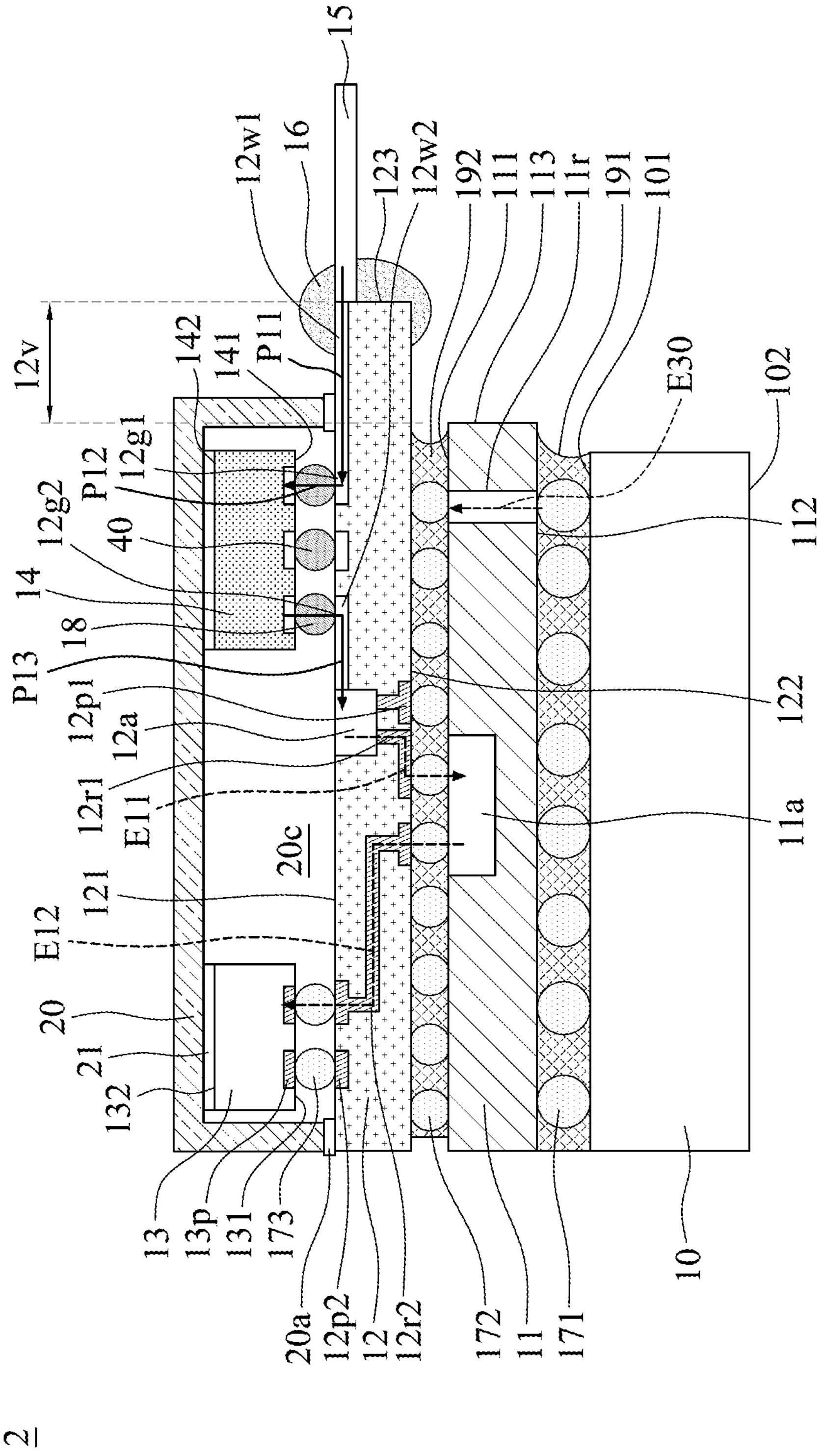
FIG. 2 is a cross-sectional view of a package structure according to some embodiments of the present disclosure.

FIG. 2 is a cross-sectional view of a package structure 2 according to some embodiments of the present disclosure. The package structure 2 in FIG. 2 is similar to the package structure 1 in FIG. 1 with differences therebetween as follows.

The package structure 2 may further include a lid (e.g., a metal lid) 20 disposed over the component 12. The lid 20 may be attached to the surface 121 of the component 12 through an adhesive material 20*a*. The lid 2 may define a cavity 20*c* to accommodate the photonic component 14 and the electronic component 13. The lid 20 may be attached to the surface 142 of the photonic component 14 and the surface 132 of the electronic component 13 through an adhesive material 21. The adhesive material 21 may be or include thermal interface material (TIM). The adhesive material 21 may include a conductive glue, such as tin-based glue. The lid 20 may function as a heat sink or connects to a further heat sink. The lid (or the heat sink) 20 may be thermally connected to the photonic component 14 and the electronic component 13. The lid 20 may be configured to dissipate heat from the package structure 2. In particular, the lid 20 may dissipate heat from the photonic component 14 and the electronic component 13 through the adhesive material 21. In some embodiments, the lid (or the heat sink) 20 may be thermally connected to the component 12 for heat dissipation.

Figure 3:
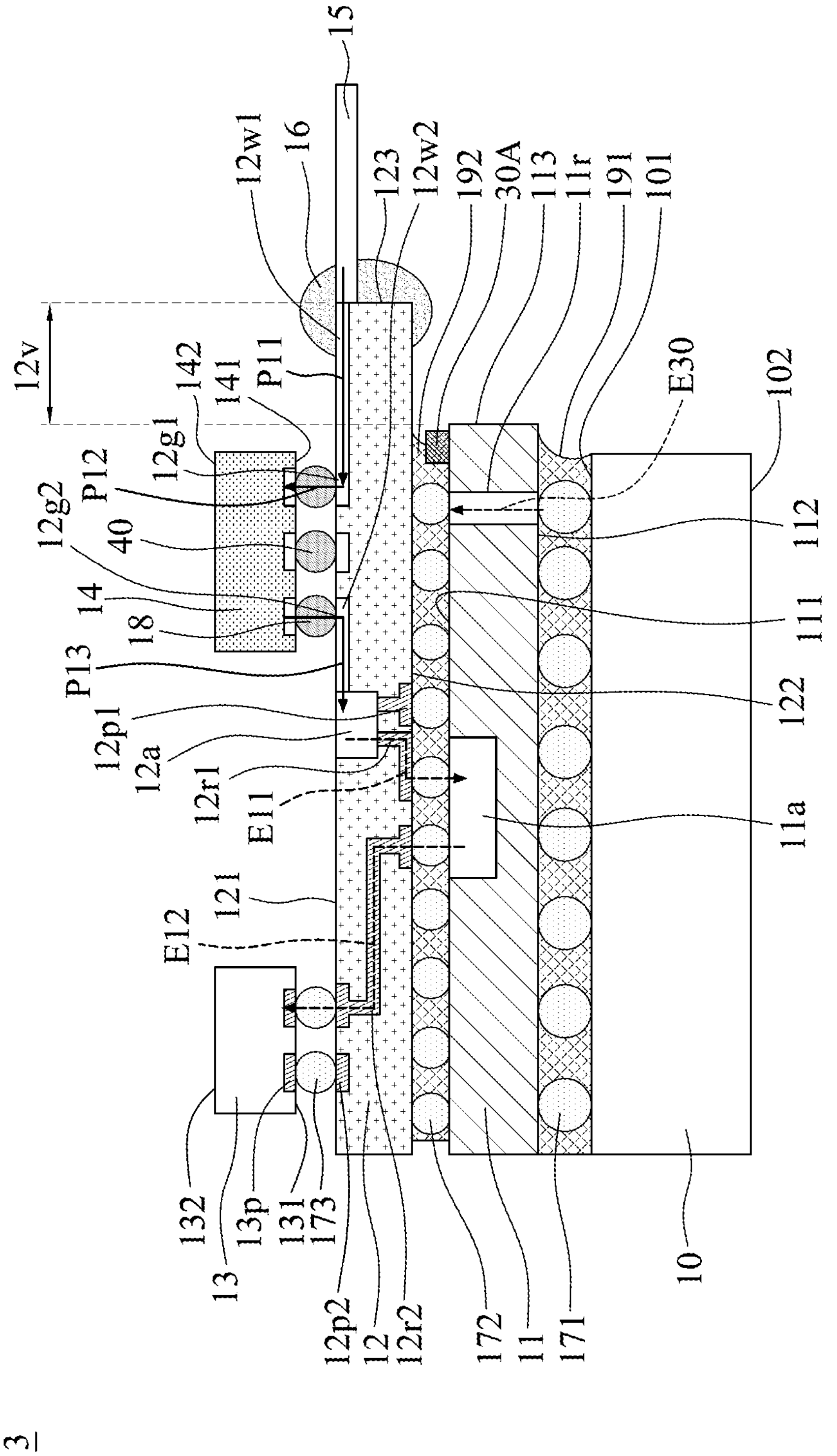
FIG. 3 is a cross-sectional view of a package structure according to some embodiments of the present disclosure.

FIG. 3 is a cross-sectional view of a package structure 3 according to some embodiments of the present disclosure. The package structure 3 in FIG. 3 is similar to the package structure 1 in FIG. 1 with differences therebetween as follows.

The package structure 3 may include a blocking structure 30A disposed on the surface 111 of the wiring structure 11. In some embodiments, the blocking structure 30A may include a wall structure. In some embodiments, the blocking structure 30A may include a protrusion from the surface 111 of the wiring structure 11. In some embodiments, the blocking structure 30A may extend between the surface 111 of the wiring structure 11 and the surface 122 of the component 12. In some embodiments, the blocking structure 30A is configured to block the protective element 192 from overflowing or contacting the lateral surface 113 of the wiring structure 11. The blocking structure 30A can be made of suitable materials. In some embodiments, the blocking structure 30A may include a solder resist layer.

According to some embodiments of the present disclosure, the blocking structure 30A can prevent the material of the protective element 192 (e.g., a protective material) from overflowing into the overhang 12*v* of the component 12 during manufacture of the package structure 3. As a result, the overhang 12*v* can be free from contacting with the protective element 192. In other words, the blocking structure 30A may prevent the protective element 192 from approaching or contacting the lateral surface 123 of the component 12. Therefore, the optical coupling efficiency of the package structure 3 and the optical component 15 will not be affected by the protective element 192. The yield of the package structure 3 can be improved. Furthermore, the blocking structure 30A may prevent the protective element 192 from contacting with the adhesive material 16, thereby preventing any cracking therebetween (induced by the CTE mismatch). At the same time, the blocking structure 30A may prevent from the contact between the protective elements 191 and 192 as discussed above.

In some embodiments where the blocking structure 30A does not contact the surface 122 of the component 12, a relatively small gap between an upper surface of the blocking structure 30A and the surface 122 of the component 12 may magnify the capillary effect and attract the protective material into the gap. Hence, the size of the blocking structure 30A may be designed to reduce such capillary effect. For example, blocking structure 30A may be relatively wide and at the same time relatively thin.

Figure 4:
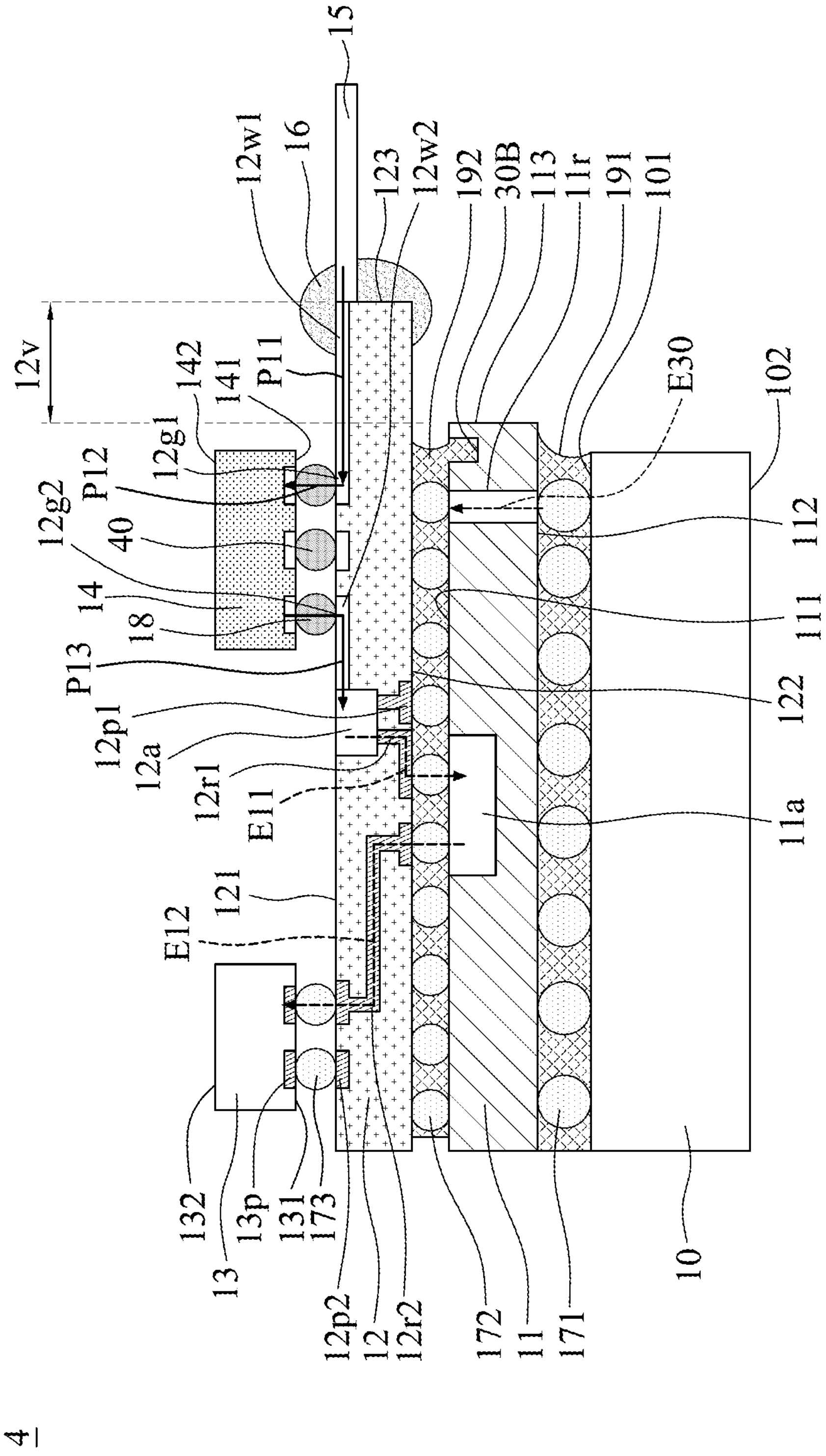
FIG. 4 is a cross-sectional view of a package structure according to some embodiments of the present disclosure.

FIG. 4 is a cross-sectional view of a package structure according to some embodiments of the present disclosure. The package structure 4 in FIG. 4 is similar to the package structure 1 in FIG. 1 with differences therebetween as follows.

The package structure 4 in FIG. 4 may include a blocking structure 30B at the surface 111 of the wiring structure 11. The blocking structure 30B is recessed from the surface 111 of the wiring structure 11. In some embodiments, the blocking structure 30B may be or include a trench recessed from the surface 111 of the wiring structure 11. In some embodiments, a portion of the protective element 192 may be filled into the trench (i.e., the blocking structure 30B) and retained therein so that the blocking structure 30B may prevent from the contact between the protective elements 191 and 192.

According to some embodiments of the present disclosure, the blocking structure 30B can prevent the material of the protective element 192 (e.g., a protective material) from overflowing into the overhang portion 12*v* of the component 12 during manufacture of the package structure 4. The blocking structure 30B may also deteriorate the capillary action in the neighboring area. The excess protective material may flow and fill in the trench, and the overhang portion 12*v*, as well as the lateral surface 123, of the component 12 can be free from contacting with the protective element 192. In other words, the blocking structure 30B may prevent the protective element 192 from approaching the lateral surface 123 of the component 12. Therefore, the optical coupling efficiency of the package structure 4 and the optical component 15 and the yield of the package structure 4 can be increased. Furthermore, the blocking structure 30B may block the protective element 192 from contacting with the adhesive material 16 or the protective element 191, thereby preventing any cracking therebetween.

Figure 5:
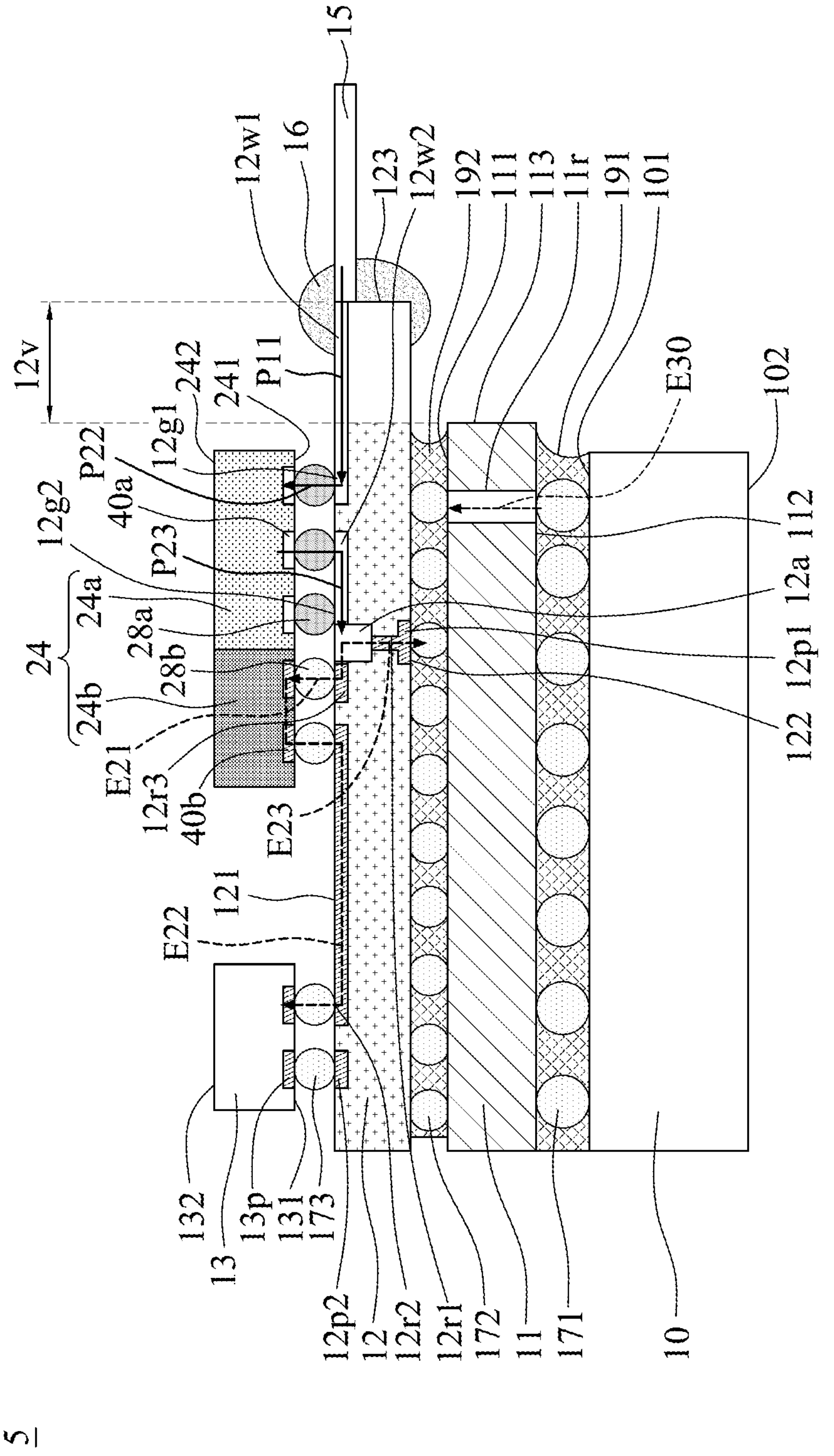
FIG. 5 is a cross-sectional view of a package structure according to some embodiments of the present disclosure.

FIG. 5 is a cross-sectional view of a package structure 5 according to some embodiments of the present disclosure. The package structure 5 may include a carrier 10, a wiring structure 11, a component 12, an electronic component 13, a set of devices 24 (two or more devices), an optical component 15, an adhesive material 16, a plurality of electrical connection elements 171, 172, and 173, a plurality of optical connection elements 28*a*, a plurality of connection elements 28*b*, a protective element 191, and a protective element 192. The carrier 10, the wiring structure 11, the component 12, the electronic component 13, the optical component 15, the adhesive material 16, the plurality of electrical connection elements 171, 172, and 173, the protective element 191, and the protective element 192 may be similar to those of the package structure 1 in FIG. 1. Therefore, some detailed descriptions may refer to the corresponding paragraphs and are not repeated hereinafter for conciseness.

The devices 24 may have a lower surface 241 facing the component 12 and an upper surface 242 opposite the lower surface 241. The upper surfaces of the devices 24 may be not at the same height. The devices 24 of the package structure 5 may include a photonic component 24*a* and an electrical device (such as a modulator driver (DRV) or modulator) 24*b*. In some embodiments, the photonic component 24*a* may be adjacent to or physically contact with the electronic device 24*b*. In some embodiments, this a gap between the photonic component 24*a* and the electronic device 24*b*. In some embodiments, the photonic component 24*a* may be integrated with the electronic device 24*b*.

The connection elements 28*a* may be optical connection elements and may be disposed between the photonic component 24*a* and the component 12. The photonic component 24*a* may include a plurality of I/O units (or optical I/O units) 40*a* at the surface 241 of the photonic component 24*a*. The photonic component 24*a* (or the I/O units 40*a*) may optically couple with the component 12 (or the waveguides 12*w*1 and 12*w*2) through the optical connection elements 28*a*. The I/O units 40*a* may include a grating structure transmitting or receiving an optical signal from the component 12 or the optical component 15.

The connection elements 28*b* may be electrical connection elements and may be disposed between the electronic device 24*b* and the component 12. The electronic device 24*b* may include a plurality of I/O units (or electrical I/O units) 40*b* at the surface 241 of the electronic device 24*b*. The electronic device 24*b* (or the I/O units 40*b*) may be electrically connected with the component 12 (or the circuit structure 12*r*2) through the electrical connection elements 28*b*. The electronic device 24*b* may be electrically connected with the electro-optic conversion unit 12*a* through a circuit structure (or an I/O unit) 12*r*3. The circuit structure 12*r*3 may be embedded in the component 12.

The optical connection elements 28*a* may include optical bumps. The electrical connection elements 28*b* may include solder balls, controlled collapse chip connection (C4) bumps, a ball grid array (BGA), or a land grid array (LGA).

The component 12 may be configured to receive an optical P11 from the optical component 15, transmit the optical signal 11 (or optical signals P22 by splitting the optical signal P11 into a plurality of beams (i.e., optical signal P12)) to the photonic component 24*a* through the optical connection element 28*a*. The photonic component 24*a* may be configured to process the optical signal P22. The photonic component 24*a* may include a photonic computing processer. The photonic component 24*a* may include one or more photonic devices to modulate, polarize, and transmit the optical signal P22. The photonic component 24*a* may be configured to generate an optical signal P23 from the optical signal P22 and then transmit the optical signal P23 to the component 12 (or the I/O units 12*g*2 of the waveguide 12*w*2) through the optical connection elements 28*a*.

The electro-optic conversion unit 12*a* may be configured to receive the optical signal P23 from the photonic component 24*a* through the waveguide 12*w*2. The electro-optic conversion unit 12*a* may be configured to convert the optical signal P23 to an electrical signal E21 and transmit it to the circuit structure 12*r*3. The circuit structure 12*r*3 may transmit the electrical signal E21 to the electronic device 24*b* which may modulate or amplify the electrical signal E21 to be an electrical signal E22. The electronic device 24*b* may be configured to transmit the electrical signal E22 to the electronic component 13 through the circuit structure 12*r*2. In some embodiments, the electro-optic conversion unit 12*a* may be configured to convert the optical signal P23 to an electrical signal E23 and transmit it to the circuit structure 12*r*1. The circuit structure 12*r*1 may transmit the electrical signal E23 to the wiring structure 11.

The photonic component 24*a* and the electronic component 13 process different types of signals. The photonic component 24*a* may process optical signals and the electronic component 13 may process electrical signals. The photonic component 24*a* may be configured to read and/or write the data stored in the electronic component 13 through the component 12. In particular, the component 12 may be configured to convert a first command (e.g., the optical signal P23 from the photonic component 24*a*) to a second command (e.g., the electrical signal E22) that is compatible with the electronic component 13. In some embodiments, the electronic component 13 may transmit data (electrical signals) to the component 12, based on the commands from the photonic component 24*a* (i.e., P23 and E22), and then the data is converted from electrical signal(s) to optical signal(s) by the electro-optic conversion unit 12*a* and transmitted to the photonic component 24*a*. The component 12 provides a hybrid transmission path (at least including electrical and optical transmission paths) for bidirectional transmitting signals between the photonic component 24*a* and the electronic component 13. Thus, the component 12 is a bridge, buffer, or an interface that realizes the communication between a photonic component, element or structure (e.g., the photonic component 24*a*) and an electronic component, element or structure (e.g., electronic component 13). With the nature of high bandwidth of optical transmission brought by the photonic component 24*a* and the component 12, the bandwidth and efficiency of the data transmission in the package structure 5 may significantly increase.

In some embodiments, with the optical I/O units 12*g*1 and 12*g*2 and the electrical I/O units 12*p*2 and 12*p*3 at the same surface, i.e., the surface 121, the component 12 is capable of connecting a photonic component, element or structure (e.g., the photonic component 24*a*) and an electronic component, element or structure (e.g., the electronic component 13) arranged at the same side of the component 12.

The package structure 5 may include the blocking structure 30A in FIG. 3 or the blocking structure 30B in FIG. 4 and some detailed descriptions may refer to the corresponding paragraphs and are not repeated hereinafter for conciseness.

Figure 5A:
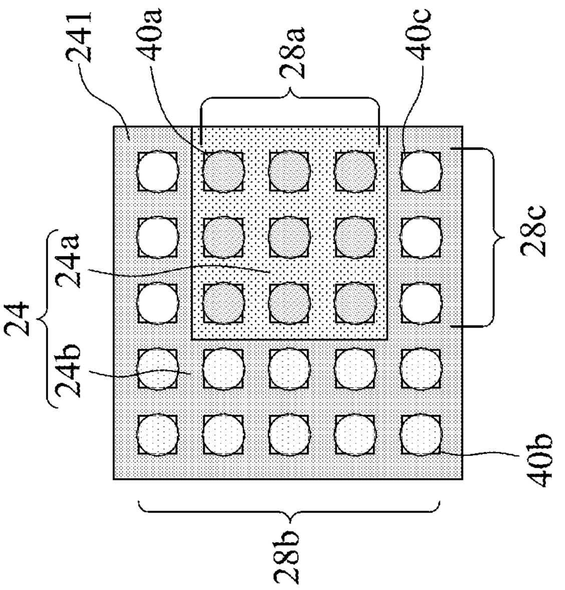
FIG. 5A is a bottom view of a set of device according to some embodiments of the present disclosure.

FIG. 5A is a bottom view of a set of devices (e.g., the set of devices 24), which can be viewed as optical chiplet, according to some embodiments of the present disclosure. The electronic device 24*b* may partially surround the photonic component 24*a*. Each of the optical connection elements 28*a* may be connected to the corresponding one of the I/O units 40*a* of the photonic component 24*a*. The I/O units 40*a* of the photonic component 24*a* and the optical connection elements 28*a* may be arrayed. The electrical connection elements 28*b* may be connected to the corresponding one of the I/O units 40*b* of the electronic device 24*b*. The I/O units 40*b* and the connection elements 28*b* may be arrayed. The electronic device 24*b* may include a plurality of I/O units 40*c* at the surface 241 of the electronic device 24*b*. A plurality of connection elements 28*c* may be electrically connected to the electronic device 24*b* (or the I/O units 40*c*). The I/O units 40*c* and the connection elements 28*c* may be arrayed. The connection elements 28*b* and 28*c* may surround the optical connection elements 28*a*. The connection elements 28*c* may be connected to the corresponding one of the I/O units 40*c*. The connection elements 28*c* may be configured to transmit a power signal and the connection elements 28*a* may be configured to transmit a data signal.

FIG. 5A illustrates one arrangement of the connection elements 40*a*, 40*b*, 40*c* but does not limit the scope of the present disclosure. As illustrated in FIG. 5A, the connection elements 40*a*, 40*b*, 40*c* may be arranged in different regions from the bottom view.

Figure 6:
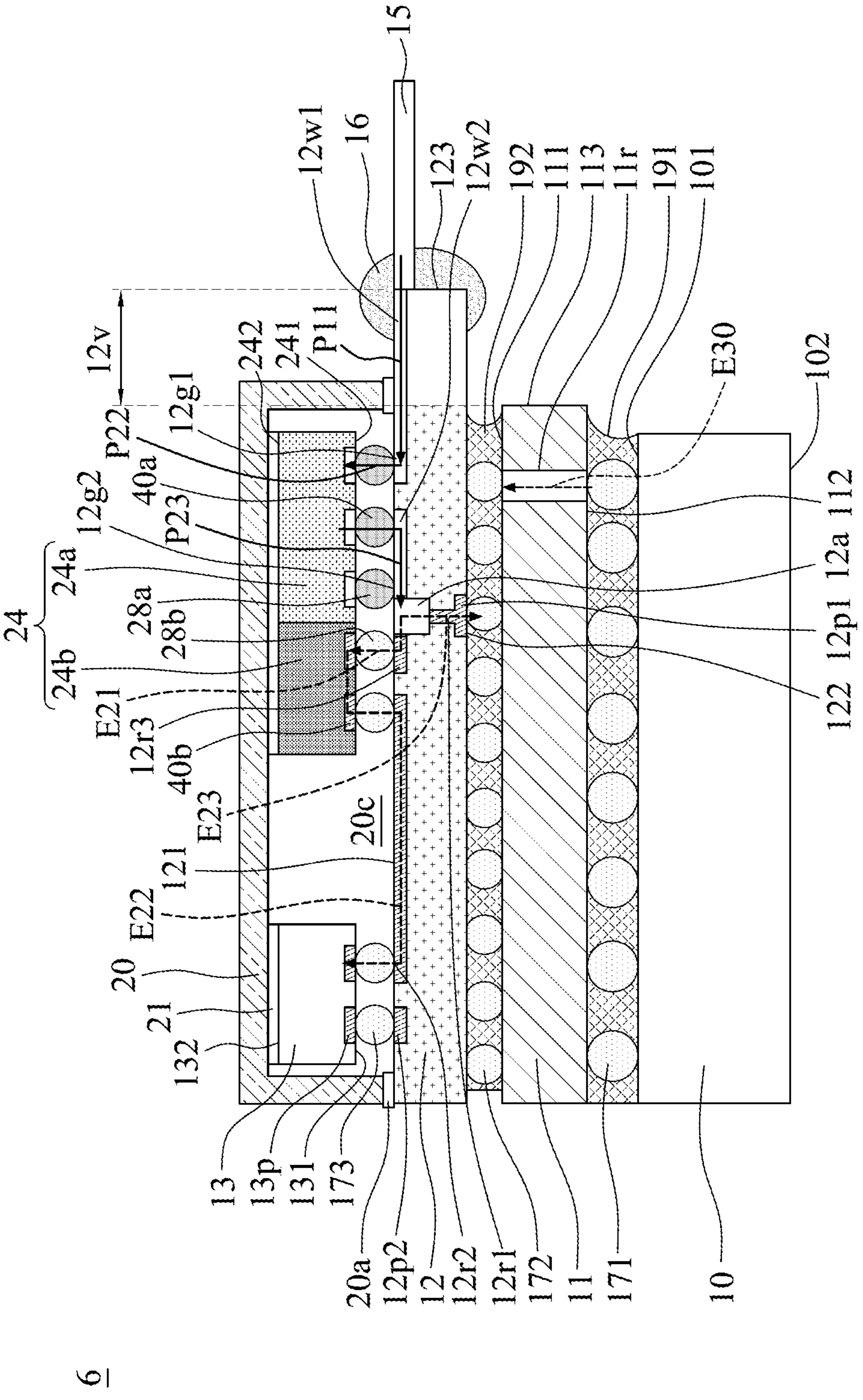
FIG. 6 is a cross-sectional view of a package structure according to some embodiments of the present disclosure.

FIG. 6 is a cross-sectional view of a package structure 6 according to some embodiments of the present disclosure. The package structure 6 in FIG. 6 is similar to the package structure 5 in FIG. 5 with differences therebetween as follows.

The package structure 6 may further include a lid 20 disposed over the component 12. The lid 20 may be attached to the surface 121 of the component 12 through an adhesive material 20*a*. The lid 2 may define a cavity 20*c* to accommodate the photonic component 24 and the electronic component 13. The lid 20 may be attached to the surface 242 of the set of devices 24 and the surface 132 of the electronic component 13 through an adhesive material 21. The adhesive material 21 may be or include thermal interface material (TIM). The adhesive material 21 may include a conductive glue, such as tin-based glue. The lid 20 may function as a heat sink. The lid 20 may be configured to dissipate the heat from the package structure 6 to an environment. In particular, the lie 20 may dissipate the heat from the set of devices 24 and the electronic component 13 through the adhesive material 21.

Spatial descriptions, such as "above," "below," "up." "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:

a bridge component having a first surface and a second surface opposite to the first surface;

an electro-optic conversion unit embedded in the bridge component and configured to convert optical signals to electrical signals or convert the electrical signals to the optical signals;

a photonic processing unit disposed over the first surface of the bridge component; and an electrical device disposed over the first surface of the bridge component;

a plurality of optical connection elements optically coupling the photonic processing unit and the bridge component, wherein the photonic processing unit is configured to receive a first optical signal from the bridge component via a first optical connection element of the plurality of optical connection elements and output a second optical signal to the bridge component via a second optical connection element of the plurality of optical connection elements in response to the first optical signal, the photonic processing unit separate from the bridge component and the electro-optic conversion unit, the first optical connection element and the second optical connection element being different, wherein the bridge component is configured to optically couple with the photonic processing unit and electrically connect with the electrical device, and wherein the photonic processing unit includes optical input/output (I/O) units and the plurality of optical connection elements are connected to the optical I/O units.

2. The package structure of claim 1, wherein the photonic processing unit is configured to process the first optical signal to generate the second optical signal.

3. The package structure of claim 2, wherein the photonic processing unit is configured to process first data carried by the first optical signal to generate second data carried by the second optical signal.

4. The package structure of claim 1, further comprising:

a plurality of electrical connection elements electrically connected to the bridge component and the electrical device, wherein the electrical connection elements are closer to the electro-optic conversion unit than to the photonic processing unit.

5. The package structure of claim 1, further comprising:

an optical fiber optically coupled with an overhang portion of the bridge component;

an adhesive material encapsulating a portion of the overhang portion of the bridge component and a coupling end of the optical fiber; and a blocking structure disposed on a wiring structure, wherein the blocking structure is disposed between the adhesive material and a protective element in a horizontal direction, wherein the blocking structure physically separates the adhesive material from the protective element such that the adhesive material is spaced apart from the protective element, and wherein the blocking structure prevents the protective element from contacting the adhesive material to reduce cracking caused by a coefficient-of-thermal-expansion (CTE) mismatch between the adhesive material and the protective element, wherein the bridge component does not include any active device other than the electro-optic conversion unit, wherein the bridge component comprises one or more optical transmission paths configured to transmit the first and second optical signals, one or more electrical transmission paths configured to transmit electrical signals, and one or more power transmission paths configured to transmit power signals.

6. The package structure of claim 1, wherein the photonic processing unit comprises a photonic computing processor configured to modulate and polarize the first optical signal and the second optical signal.

7. The package structure of claim 1, wherein the electro-optic conversion unit is closer to the electrical device than the photonic processing unit.

8. The package structure of claim 1, wherein the bridge component includes an overhang structure, and the package structure further comprises an optical fiber optically coupled with the overhang structure of the bridge component and communicating with the photonic processing unit, wherein the optical fiber is non-overlapping with the photonic processing unit in a vertical direction, wherein the bridge component comprises:

a first optical waveguide optically coupled to and in direct contact with the optical fiber, the first optical waveguide to transmit the first optical signal from the optical fiber to the photonic processing unit, the first optical waveguide embedded within the bridge component, the first optical waveguide adjacent to and extending along the first surface of the bridge component, the first optical waveguide partially disposed in the overhang structure, and a second optical waveguide optically coupled to and in direct contact with the electro-optic conversion unit, the second optical waveguide to transmit the second optical signal from the photonic processing unit to the electro-optic conversion unit, the second optical waveguide embedded within the bridge component, the second optical waveguide adjacent to and extending along the first surface of the bridge component, the second optical waveguide outside the overhang structure.

9. The package structure of claim 8, wherein the bridge component further comprises a third optical waveguide disposed between the first optical waveguide and the second optical waveguide, and wherein the first, second, and third optical waveguides connected to the optical connection elements.

10. The package structure of claim 8, wherein the photonic processing unit and the electrical device are included in a set of devices disposed over the bridge component, wherein the electrical device partially surrounds the photonic processing unit in a bottom view, wherein the bridge component is configured to receive a third optical signal from an optical component and split the third optical signal into a plurality of optical beams, wherein the bridge component is configured to transmit the plurality of optical beams to the photonic processing unit through a first waveguide and the optical connection elements, wherein the photonic processing unit is configured to process the plurality of optical beams and generate the second optical signal, wherein the electro-optic conversion unit is configured to receive the second optical signal from the photonic processing unit through a second waveguide and convert the second optical signal into a first electrical signal, and wherein the electrical device is configured to receive the first electrical signal from the electro-optic conversion unit through a circuit structure embedded in the bridge component and modulate or amplify the first electrical signal into a second electrical signal.

11. The package structure of claim 8, wherein the optical connection elements comprise a plurality of optical bumps disposed above the first surface encapsulated by a molding compound, wherein the molding compound is spaced apart from the overhanging structure.

12. A package structure, comprising:

a signal transmission component comprising a plurality of first optical I/O units and a plurality of electrical I/O units; and an electro-optic conversion unit embedded in the signal transmission component and configured to convert optical signals to electrical signals or convert the electrical signals to the optical signals, wherein the signal transmission component comprises a plurality of first transmission paths configured to transmit the optical signals from or to the optical first I/O units, and a second transmission path configured to transmit the electrical signals from or to the electrical I/O units, and wherein the electro-optic conversion unit connects with the first transmission path or the second transmission path or both;

a photonic processing unit disposed over the signal transmission component; and a plurality of optical connection elements optically coupling the photonic processing unit and the signal transmission component, wherein the photonic processing unit is configured to receive a first optical signal of the optical signals from the signal transmission component via a first optical connection element of the plurality of optical connection elements and output a second optical signal of the optical signals to the signal transmission component via a second optical connection element of the plurality of optical connection elements in response to the first optical signal, the photonic processing unit separate from the signal transmission component and the electro-optic conversion unit, the first optical connection element and the second optical connection element being different, wherein the photonic processing unit includes second optical I/O units and the plurality of optical connection elements are connected to the second optical I/O units.

13. The package structure of claim 12, wherein the signal transmission component includes an overhang structure, and the package structure further comprises an optical fiber optically coupled with the overhang structure of the signal transmission component and communicating with the photonic processing unit, wherein the optical fiber is non-overlapping with the photonic processing unit in a vertical direction, wherein the signal transmission component comprises:

a first optical waveguide optically coupled to and in direct contact with the optical fiber, the first optical waveguide to transmit the first optical signal from the optical fiber to the photonic processing unit, the first optical waveguide embedded within the signal transmission component, the first optical waveguide adjacent to and extending along a first surface of the signal transmission component, the first optical waveguide partially disposed in the overhang structure, and a second optical waveguide optically coupled to and in direct contact with the electro-optic conversion unit, the second optical waveguide to transmit the second optical signal from the photonic processing unit to the electro-optic conversion unit, the second optical waveguide embedded within the signal transmission component, the second optical waveguide adjacent to and extending along the first surface of the signal transmission component, the second optical waveguide outside the overhang structure.

14. The package structure of claim 13, further comprising:

a molding compound encapsulating the photonic processing unit and the optical connection elements, and spaced apart from a coupling end of the optical fiber.

15. The package structure of claim 12, wherein the optical I/O units comprise a plurality of grating structures disposed at a first surface of the photonic processing unit and configured to receive the first optical signal or transmit the second optical signal.

16. The package structure of claim 15, wherein the photonic processing unit is configured to process the first optical signal from an optical fiber transmitted via the signal transmission component to generate the second optical signal.

17. The package structure of claim 16, further comprising a memory disposed over the signal transmission component, wherein the electrical I/O units and the optical I/O units are disposed over the embedded electro-optic converter, which is non-overlapping with the electrical I/O units and the optical I/O units in a vertical direction, wherein the electro-optic conversion unit is closer to the memory than the photonic processing unit.

18. A package structure, comprising:

a bridge component comprising a first surface, a second surface opposite to the first surface, and a lateral surface extending between the first surface and the second surface;

an electro-optic conversion unit embedded in the bridge component and configured to convert optical signals to electrical signals or convert the electrical signals to the optical signals;

a photonic processing unit disposed over and optically connecting with the first surface of the bridge component;

a plurality of optical connection elements optically coupling the photonic processing unit and the bridge component, wherein the photonic processing unit is configured to receive a first optical signal from the bridge component via a first optical connection element of the plurality of optical connection elements and output a second optical signal to the bridge component via a second optical connection element of the plurality of optical connection elements in response to the first optical signal, the photonic processing unit separate from the bridge component and the electro-optic conversion unit, the first optical connection element and the second optical connection element being different; and an optical component optically connecting with the lateral surface of the bridge component, wherein the optical component communicates with the photonic processing unit through the bridge component, and wherein the photonic processing unit includes optical input/output (I/O) units and the plurality of optical connection elements are connected to the optical I/O units.

19. The package structure of claim 18, wherein the bridge component includes an overhang structure having the lateral surface, and the optical component optically coupled with the overhang structure of the bridge component, wherein the optical component is non-overlapping with the photonic processing unit in a vertical direction, wherein the bridge component comprises:

a first optical waveguide optically coupled to and in direct contact with the optical component, the first optical waveguide to transmit the first optical signal from the optical component to the photonic processing unit, the first optical waveguide embedded within the bridge component, the first optical waveguide adjacent to and extending along the first surface of the bridge component, the first optical waveguide partially disposed in the overhang structure, and a second optical waveguide optically coupled to and in direct contact with the electro-optic conversion unit, the second optical waveguide to transmit the second optical signal from the photonic processing unit to the electro-optic conversion unit, the second optical waveguide embedded within the bridge component, the second optical waveguide adjacent to and extending along the first surface of the bridge component, the second optical waveguide outside the overhang structure.

20. The package structure of claim 18, wherein the optical connection elements comprise a plurality of optical bumps disposed between the photonic processing unit and the bridge component.

* * * * *